(12) United States Patent
Cheng et al.

(10) Patent No.: US 8,105,901 B2
(45) Date of Patent: Jan. 31, 2012

(54) METHOD FOR DOUBLE PATTERN DENSITY

(75) Inventors: Kangguo Cheng, Guilderland, NY (US); Bruce B. Doris, Brewster, NY (US); Toshiharu Furukawa, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 140 days.

(21) Appl. No.: 12/509,900

(22) Filed: Jul. 27, 2009

(65) Prior Publication Data

US 2011/0021010 A1    Jan. 27, 2011

(51) Int. Cl.
*H01L 21/336* (2006.01)

(52) U.S. Cl. ......... 438/268; 257/E29.028; 257/E21.703; 257/401

(58) Field of Classification Search .............. 438/268; 257/E21.703, E29.028, 401
See application file for complete search history.

(56) References Cited

U.S. PATENT DOCUMENTS

| | | | |
|---|---|---|---|
| 4,959,326 A | 9/1990 | Roman et al. |
| 6,007,732 A | 12/1999 | Hashimoto et al. |
| 6,194,268 B1 | 2/2001 | Furukawa et al. |
| 6,391,753 B1 | 5/2002 | Yu |
| 6,391,782 B1 | 5/2002 | Yu |
| 6,413,802 B1 | 7/2002 | Hu et al. |
| 6,475,869 B1 | 11/2002 | Yu |
| 6,492,212 B1 | 12/2002 | Ieong et al. |
| 6,566,019 B2 | 5/2003 | Kling et al. |
| 6,611,029 B1 | 8/2003 | Ahmed et al. |
| 6,642,090 B1 | 11/2003 | Fried et al. |
| 6,645,797 B1 | 11/2003 | Buynoski et al. |
| 6,657,259 B2 | 12/2003 | Fried et al. |
| 6,720,231 B2 | 4/2004 | Fried et al. |
| 6,781,674 B1 | 8/2004 | Galburt et al. |
| 6,960,510 B2 | 11/2005 | Deshpande et al. |
| 6,965,427 B2 | 11/2005 | Galburt et al. |
| 7,050,156 B2 | 5/2006 | Galburt et al. |
| 7,053,990 B2 | 5/2006 | Galburt et al. |
| 7,056,781 B2 | 6/2006 | Yoon et al. |
| 7,064,413 B2 | 6/2006 | Fried et al. |
| 7,256,873 B2 | 8/2007 | Finders et al. |
| 7,301,210 B2 | 11/2007 | Abadeer et al. |
| 7,310,797 B2 | 12/2007 | Huckabay |
| 2007/0196986 A1 | 8/2007 | Ichige et al. |
| 2008/0008969 A1 | 1/2008 | Zhou et al. |
| 2008/0038847 A1 | 2/2008 | Young |

OTHER PUBLICATIONS

Choi, et al., "Sublithographic Nanofabrication Technology for Nanocatalysts and DNA Chips," Journal of Vacuum Science & Technology B (Microelectronics and Nanometer Structures), vol. 21, No. 6, pp. 2951-2955.

*Primary Examiner* — Bradley K Smith
*Assistant Examiner* — Amar Movva
(74) *Attorney, Agent, or Firm* — Gibb I.P. Law Firm, LLC

(57) ABSTRACT

A method deposits an undoped silicon layer on a primary layer, deposits a cap layer on the undoped silicon layer, patterns a masking layer on the cap layer, and patterns the undoped silicon layer into silicon mandrels. The method incorporates impurities into sidewalls of the silicon mandrels in a process that leaves sidewall portions of the silicon mandrels doped with impurities and that leaves central portions of at least some of the silicon mandrels undoped. The method removes the cap layer to leave the silicon mandrels standing on the primary layer and performs a selective material removal process to remove the central portions of the silicon mandrels and to leave the sidewall portions of the silicon mandrels standing on the primary layer. The method patterns at least the primary layer using the sidewall portions of the silicon mandrels as a patterning mask and removes the sidewall portions of the silicon mandrels to leave at least the primary layer patterned.

20 Claims, 9 Drawing Sheets

METHOD FOR DOUBLE PATTERN DENSITY

BACKGROUND

1. Field of the Invention

The embodiments of the invention generally relate to methods for forming integrated circuit structures and, more specifically, to a methodology that utilizes sidewalls of doped silicon mandrels to pattern underlying layers.

2. Description of the Related Art

Fabrication of integrated circuits usually requires forming multiple patterns, including sublithography patterns, on the same chip. For example, fin-type field effect transistors (FinFETs) have been emerging as a promising new approach for continued scaling of complementary metal oxide semiconductor (CMOS) technology. Sidewall spacer imaging transfer (SIT) is one of the common methods for forming narrow fins beyond the printing capability of optical lithography. Conventional SIT methods form all fins to have the same width across the chip. Some applications, however, require fins with different widths on the same chip. For example, various FinFET devices on the same chip may require different fin width for different threshold voltages. In another example, FinFET devices may be formed on the same chip with other devices such as tri-gate devices or planar devices which require different fin widths than the fin width for FinFET devices.

SUMMARY

In view of the foregoing, disclosed herein are various methods that deposit an undoped silicon layer on a primary layer. One embodiment deposits a cap layer on the undoped silicon layer. The embodiment patterns a masking layer on the cap layer, and the masking layer has openings. The embodiment patterns the undoped silicon layer into silicon mandrels by removing portions of the undoped silicon layer and corresponding portions of the cap layer exposed by said openings in said masking layer. The embodiment removes the photoresist layer to leave the silicon mandrels standing on the primary layer and cap layer mandrels on the silicon mandrels. The embodiment incorporates impurities into sidewalls of the silicon mandrels in a process that leaves sidewall portions of the silicon mandrels doped with impurities and that leaves central portions of at least some of the silicon mandrels undoped. The central portions of the silicon mandrels are between the sidewall portions of the silicon mandrels, within individual silicon mandrels. The embodiment removes the cap layer mandrels to leave the silicon mandrels standing on the primary layer. The embodiment performs a selective material removal process to remove the central portions of the silicon mandrels, and to leave the sidewall portions of the silicon mandrels standing on the primary layer. The embodiment patterns at least the primary layer using the sidewall portions of the silicon mandrels as a patterning mask. The embodiment removes the sidewall portions of the silicon mandrels to leave at least the primary layer patterned.

Another embodiment comprises a method that deposit an undoped silicon layer on a primary layer. This embodiment deposits a cap layer on the undoped silicon layer. The embodiment patterns a masking layer on the cap layer, and the masking layer has openings. The embodiment patterns the undoped silicon layer into silicon mandrels by removing portions of the undoped silicon layer and corresponding portions of the cap layer exposed by the openings in the masking layer. The openings are spaced such that ones of the silicon mandrels are formed into different sizes. The embodiment removes the photoresist layer to leave the silicon mandrels standing on the primary layer and cap layer mandrels on the silicon mandrels. The embodiment incorporates impurities into sidewalls of the silicon mandrels in a process that leaves sidewall portions of the silicon mandrels doped with impurities, which leaves central portions of at least some of the silicon mandrels undoped. The central portions of the silicon mandrels are between the sidewall portions of the silicon mandrels, within individual silicon mandrels. The embodiment removes the cap layer mandrels to leave the silicon mandrels standing on the primary layer. The embodiment performs a selective material removal process to remove the central portions of the silicon mandrels and to leave the sidewall portions of the silicon mandrels standing on the primary layer. The embodiment patterns at least the primary layer using the sidewall portions of the silicon mandrels as a patterning mask. The embodiment removes the sidewall portions of the silicon mandrels to leave at least the primary layer patterned.

Also disclosed is a method that deposits an undoped silicon layer on a primary layer. One method deposits a cap layer on the undoped silicon layer. The method patterns a masking layer on the cap layer, and the masking layer has openings. The method patterns the undoped silicon layer into silicon mandrels by removing portions of the undoped silicon layer and corresponding portions of the cap layer exposed by the openings in the masking layer. The openings are spaced such that ones of the silicon mandrels are formed into different sizes. The method removes the masking layer to leave the silicon mandrels standing on the primary layer and cap layer mandrels on the silicon mandrels. The method incorporates impurities into sidewalls of the silicon mandrels in a process that leaves sidewall portions of the silicon mandrels doped with impurities, which leaves central portions of at least some of the silicon mandrels undoped. The central portions of the silicon mandrels are between the sidewall portions of the silicon mandrels, within individual silicon mandrels. Some of the silicon mandrels do not have the central portions that are undoped, and only have the sidewall portions that are doped. The method removes the cap layer mandrels to leave the silicon mandrels standing on the primary layer. The method performs a selective material removal process to remove the central portions of the silicon mandrels and to leave differently sized sidewall portions of the silicon mandrels standing on the primary layer. The silicon mandrels that do not have the central portions that are undoped only have the sidewall portions that are doped, comprise larger sidewall portions relative to smaller sidewall portions of the silicon mandrels that have the central portions. The method patterns at least the primary layer using the different sized sidewall portions of the silicon mandrels as a patterning mask. The method removes the sidewall portions of the silicon mandrels to leave at least the primary layer patterned.

Another method disclosed herein deposits an undoped silicon layer on a primary layer. One embodiment deposits a nitride cap layer on the undoped silicon layer. The embodiment patterns an organic masking layer on the cap layer, and the masking layer has openings. The embodiment patterns the undoped silicon layer into silicon mandrels by performing an etching process to remove portions of the undoped silicon layer and corresponding portions of the cap layer exposed by the openings in the masking layer. The openings are spaced such that ones of the silicon mandrels are formed into different sizes. The embodiment removes the masking layer to leave the silicon mandrels standing on the primary layer and cap layer mandrels on the silicon mandrels. The embodiment implants boron impurities into sidewalls of the silicon mandrels in a process that leaves sidewall portions of the silicon mandrels doped with impurities, which leaves central portions of at least some of the silicon mandrels undoped. The central portions of the silicon mandrels are between the sidewall portions of the silicon mandrels, within individual silicon mandrels. Some of the silicon mandrels do not have the central portions that are undoped, and only have the sidewall portions that are doped. The embodiment removes the cap layer mandrels to leave the silicon mandrels standing on the primary layer. The embodiment performs a selective ammonia etching material removal process to remove the central portions of the silicon mandrels and to leave differently sized sidewall portions of the silicon mandrels standing on the primary layer. The ones of the silicon mandrels that do not have the central portions that are undoped, and only have the sidewall portions that are doped, comprise larger sidewall portions relative to smaller sidewall portions of the silicon mandrels that have the central portions. The embodiment patterns at least the primary layer using the different sized sidewall portions of the silicon mandrels as a patterning mask. The embodiment removes the sidewall portions of the silicon mandrels to leave at least the primary layer patterned.

BRIEF DESCRIPTION OF THE DRAWINGS

The embodiments of the invention will be better understood from the following detailed description with reference to the drawings, which are not necessarily drawing to scale and in which.

DETAILED DESCRIPTION

As mentioned above, conventional SIT methods form all fins to have the same width across the chip. Some applications, however, require fins with different widths on the same chip. Thus, the embodiments herein utilize methods that implant impurities into sidewalls of differently sized silicon mandrels in a process that leaves sidewall portions of the silicon mandrels doped with impurities and that leaves central portions of at least some of the silicon mandrels undoped. The methods perform a selective material removal process to remove the central portions of the silicon mandrels and to leave the sidewall portions of the silicon mandrels standing on the primary layer.

At least some of the relatively more narrow silicon mandrels are not wide enough to have any central portion that is undoped, and only have the sidewall portions that are doped (the silicon mandrel is fully doped across its entire width). This occurs because, in the relatively more narrow silicon mandrels, the width of the implanted portions (sidewalls) is greater than one-half the width of the silicon mandrels, where the sidewall portions adjoin each other in pairs, allowing the entire relatively more narrow silicon mandrel to contain the implanted impurity. The method then patterns at least the primary layer using the sidewall portions of the silicon mandrels as a patterning mask and removes the sidewall portions of the silicon mandrels to leave at least the primary layer patterned.

Figure 1:
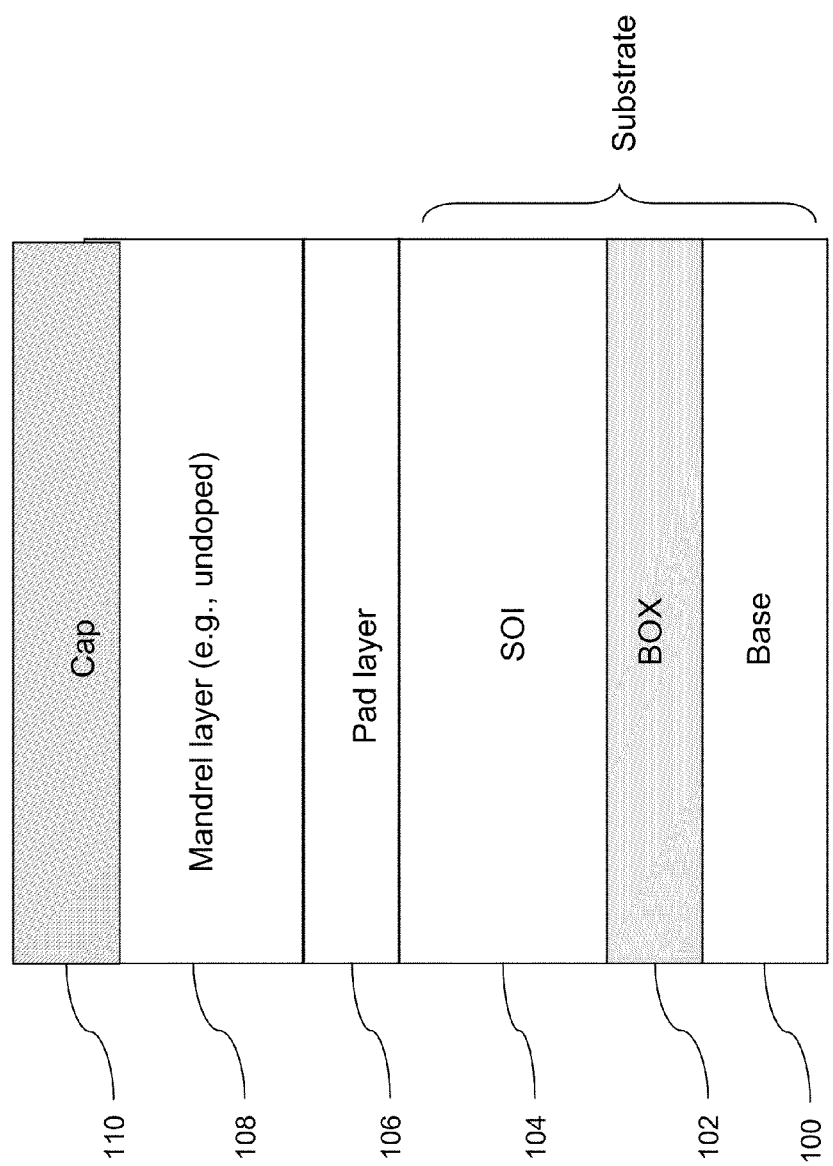
FIG. 1 is a schematic cross-sectional diagram of a partially completed integrated circuit structure according to embodiments herein.

More specifically, as shown in cross-sectional view in FIGS. 1-9, disclosed herein are various methods of forming sub-lithographic structures which begin by depositing an undoped silicon layer 108 (undoped amorphous silicon or undoped polysilicon) on a pad layer (sometimes referred to herein as a primary layer) 106 and depositing a hard cap layer 110 (e.g., nitride, etc.) on the undoped silicon layer 108 (FIG. 1). FIG. 1 also illustrates the substrate 100-104 upon which the primary layer 106 is formed. The substrate 100-104 includes a base layer 100, a buried oxide (BOX) layer 102 and a silicon-on-insulator (SOI) layer 104 (that eventually will be patterned into fins). Alternatively, the substrate 104 may comprise any other semiconductor material such as silicon, germanium, silicon germanium, silicon carbide, III-V compound semiconductors (e.g., GaAs), and II-VI compound semiconductors (e.g., CdSe). The substrate may also comprise an organic semiconductor or a layered semiconductor such as, for example, Si/SiGe, a silicon-on-insulator or a SiGe-on-insulator. A portion or entire semiconductor substrate may be amorphous, polycrystalline, or monocrystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain. The semiconductor substrate may further comprise previously formed patterns (not shown). The processes and materials utilized to form such structures are well-known to those ordinarily skilled in the art and are not discussed in detail herein. For example, formation processes can include chemical vapor deposition (CVD), plasma enhanced chemical vapor deposition (PECVD), chemical solution deposition, evaporation, and atomic layer deposition (ALD), etc.

Figure 2:
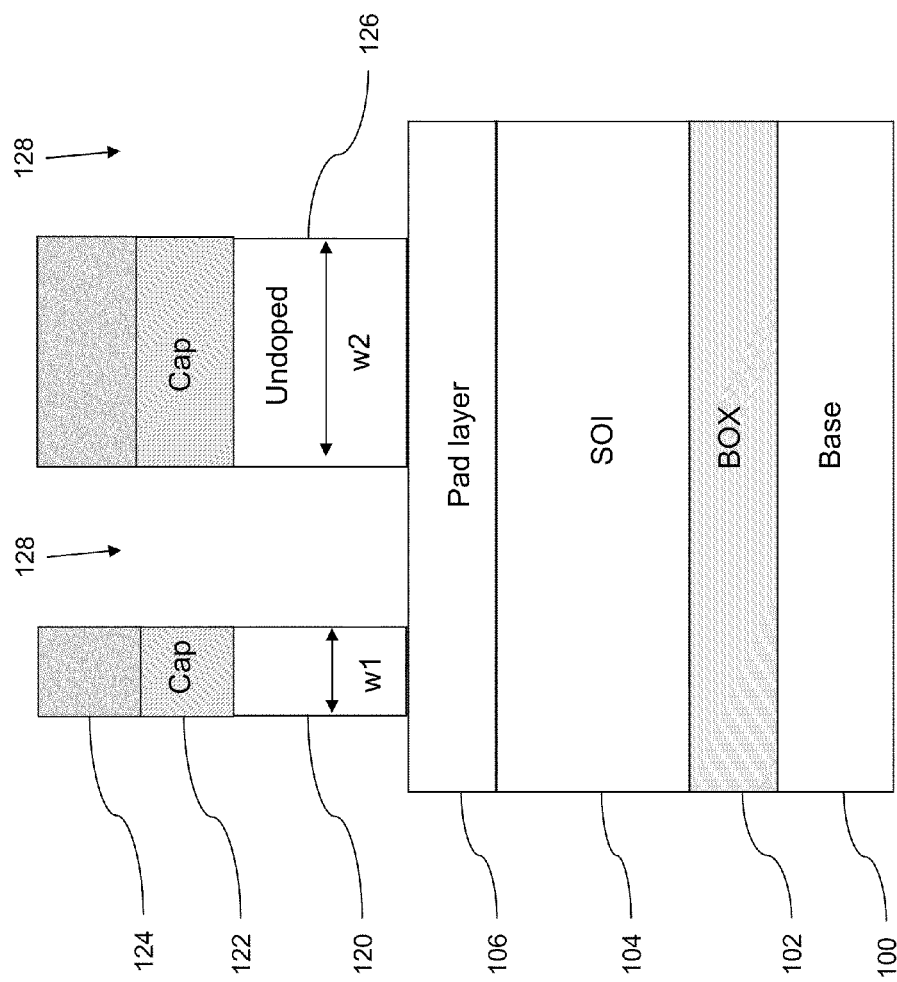
FIG. 2 is a schematic cross-sectional diagram of a partially completed integrated circuit structure according to embodiments herein.

As shown in FIG. 2, a masking layer 124 (e.g., photoresist, etc.) is patterned on the cap layer 110 using conventional resist processing including exposure, development, etc. The undoped silicon layer 108 is patterned into silicon mandrels 120, 126 by performing a material removal process (e.g., reactive ion etching, ion beam etching, plasma etching, laser ablation, etc.) to remove portions of the undoped silicon layer 108 and corresponding portions of the cap layer 110 exposed by openings 128 in the photoresist layer 124.

The openings 128 in the photoresist layer 124 are spaced such that at least some of the silicon mandrels 120, 126 are formed into different sizes. The photoresist layer 124 is then removed to leave the silicon mandrels 120, 126 standing on the primary layer 106 and cap layer portions (e.g., cap layer mandrels 122) on the silicon mandrels 120, 126.

Figure 3:
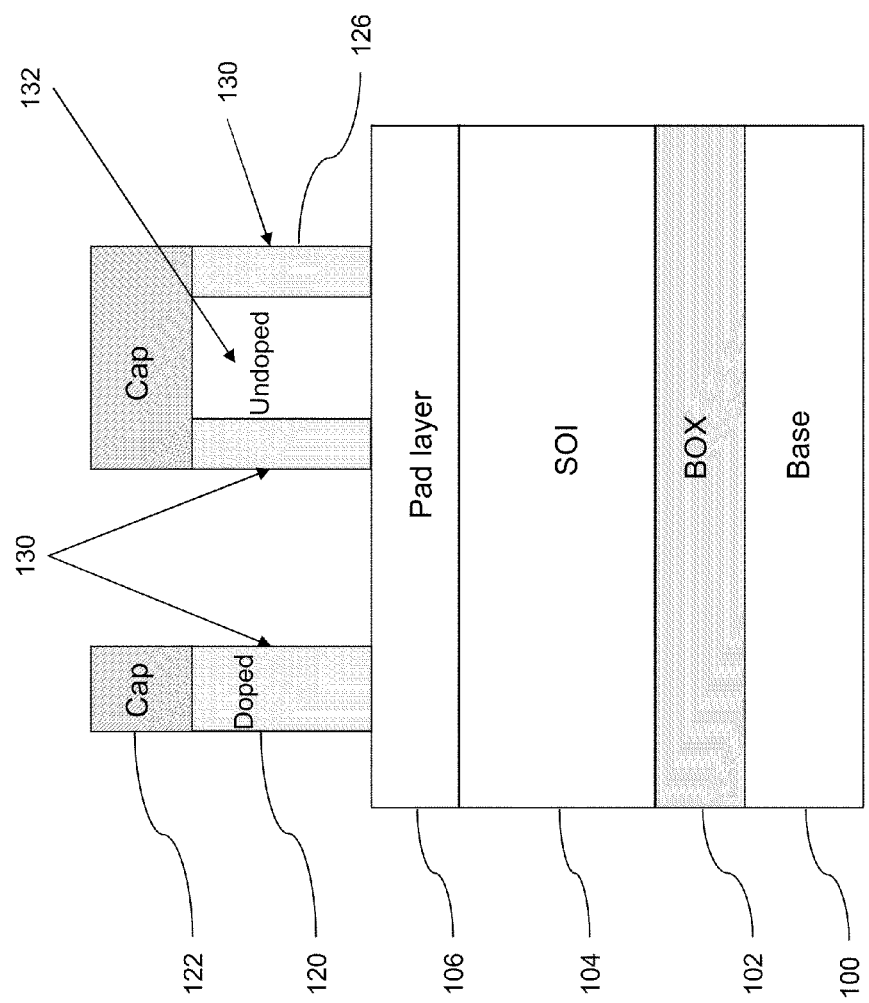
FIG. 3 is a schematic cross-sectional diagram of a partially completed integrated circuit structure according to embodiments herein.
Figure 4:
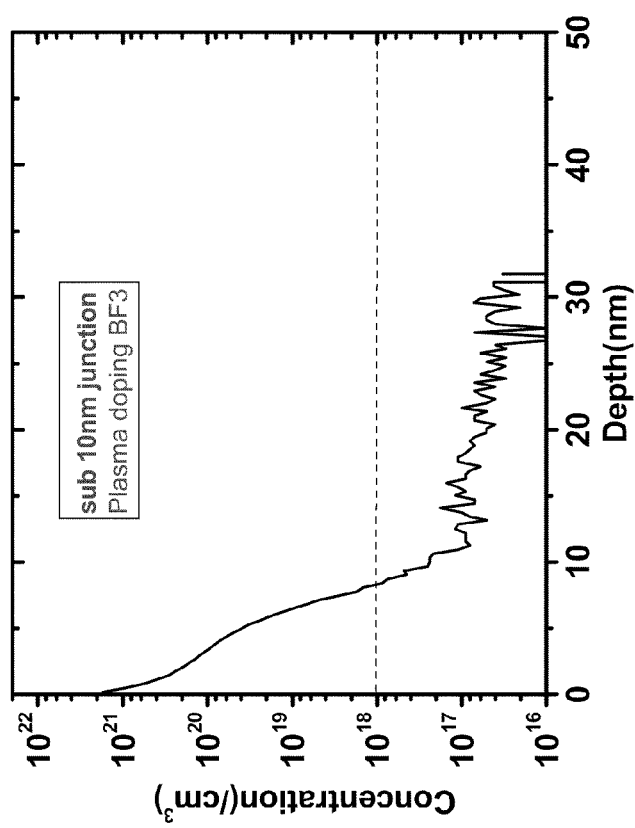
FIG. 4 is a chart illustrating the relationship between boron plasma doping concentration and depth of impurity implantation.

As shown in FIG. 3, the method then incorporates impurities (e.g., boron, indium, etc.) into sidewalls of the silicon mandrels 120, 126 in a process that leaves sidewall portions 130 of the silicon mandrels 120, 126 doped with impurities and that leaves central portions 132 of at least some of the silicon mandrels 120, 126 undoped. The "central" portions 132 of the silicon mandrels 120, 126 are between the "sidewall" portions 130 of the silicon mandrels 120, 126, within the individual silicon mandrels 120, 126 that are wide enough to form such portions. The process of incorporating impurities can comprise, for example, an angled ion implantation process, gas phase doping, plasma doping, plasma immersion ion implantation, cluster doping, infusion doping, liquid phase doping, solid phase doping, etc. One example of the plasma doping concentration and depth of impurity implantation that can be used is shown in FIG. 4.

Some embodiments herein form all the silicon mandrels to be the same size (have the same width w1 or w2 (FIG. 2)); while other embodiments will be formed to have different widths (w1 and w2). If different width silicon mandrels are formed, at least some of the relatively more narrow silicon mandrels 120 are not wide enough to have the central portions 132 that are undoped, and only have the sidewall portions 130 that are doped. This occurs because, in the relatively more narrow silicon mandrels 120, the width of the implanted portions (sidewalls) 130 is greater than one-half the width w1 of the silicon mandrels 120. In such mandrels 120, the sidewall portions 130 adjoin each other in pairs, allowing the entire relatively more narrow silicon mandrel 120 to contain the implanted impurity. The doped portion is defined as a portion that contains an impurity with a concentration greater than a certain value (e.g., $10^{18}$ cm$^{-3}$) and the undoped portion is defined a portion with the concentration of the impurities substantially less than a certain value (e.g., $10^{18}$ cm$^{-3}$).

Figure 5:
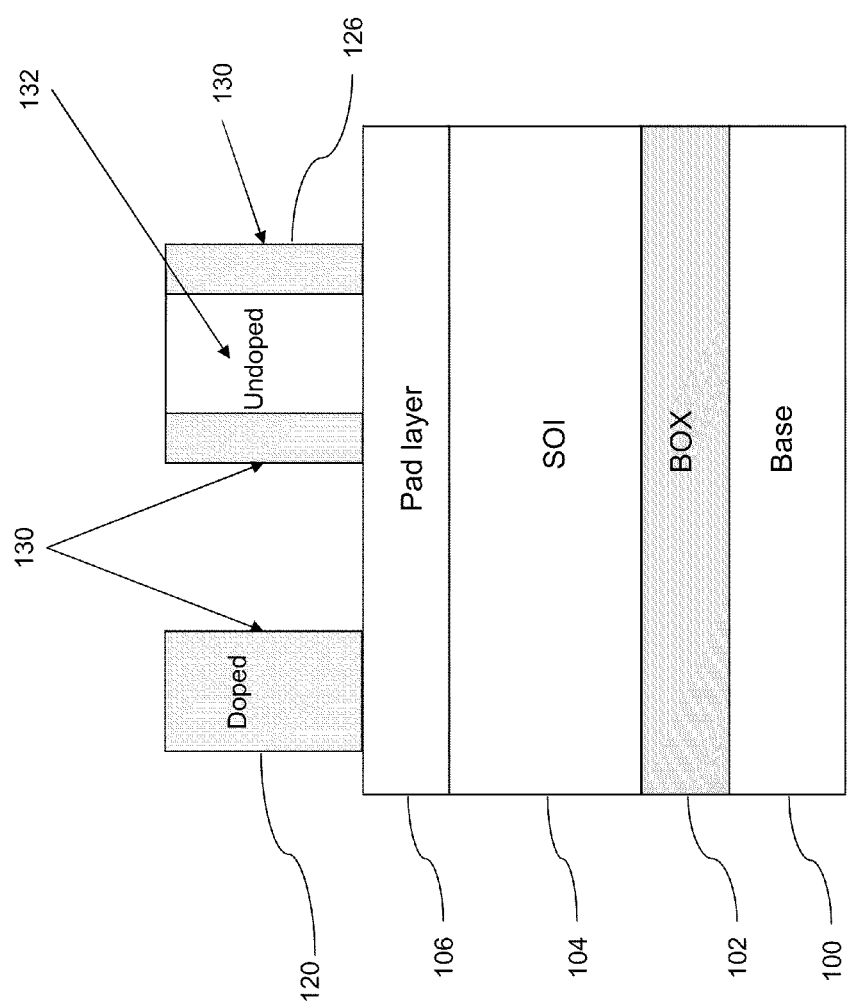
FIG. 5 is a schematic cross-sectional diagram of a partially completed integrated circuit structure according to embodiments herein.
Figure 6:
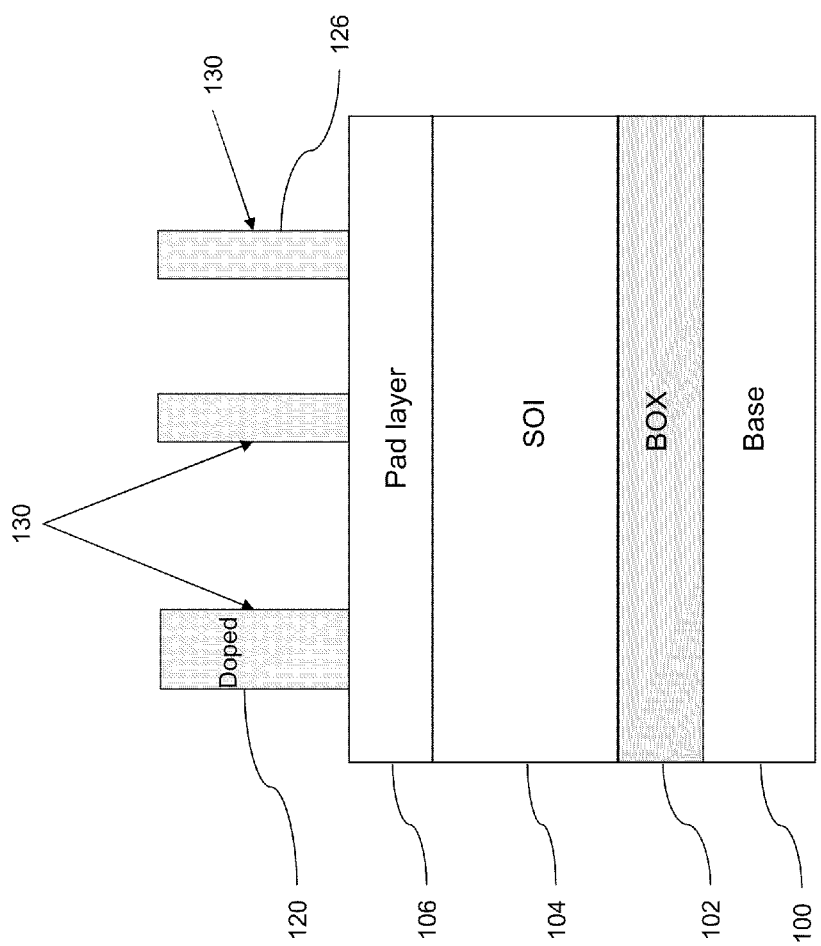
FIG. 6 is a schematic cross-sectional diagram of a partially completed integrated circuit structure according to embodiments herein.

Next, as shown in FIG. 5, the method removes the cap layer 110 mandrels to leave the silicon mandrels 120, 126 standing unprotected on the primary layer 106. In FIG. 6, a selective etching material removal process (e.g., an etch process with an aqueous solution containing ammonia) is performed to remove the undoped central portions 132 of the silicon mandrels 120, 126 and to leave the sidewall portions 130 of the silicon mandrels 120, 126 standing on the primary layer 106.

For embodiments that form different width silicon mandrels 120, 126, this process leaves differently sized sidewall portions 130 of the silicon mandrels standing on the primary layer 106. The ones of the silicon mandrels 120 that did not have the central portions 132 that were undoped (and only had the adjoining sidewall portions 130 that were doped) in effect comprise larger combined sidewall portions 130 relative to the smaller individual sidewall portions 130 of the silicon mandrels 126 that had been separated by the (now removed) central portions 132. The larger combined sidewall portions 130 can be up to twice as large as the individual sidewall portions 130.

Figure 7:
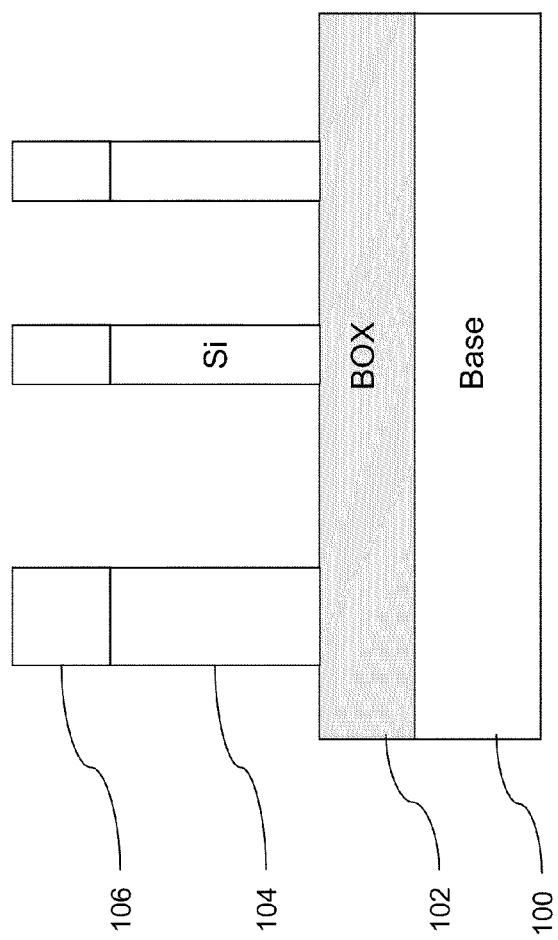
FIG. 7 is a schematic cross-sectional diagram of a partially completed integrated circuit structure according to embodiments herein.
Figure 8:
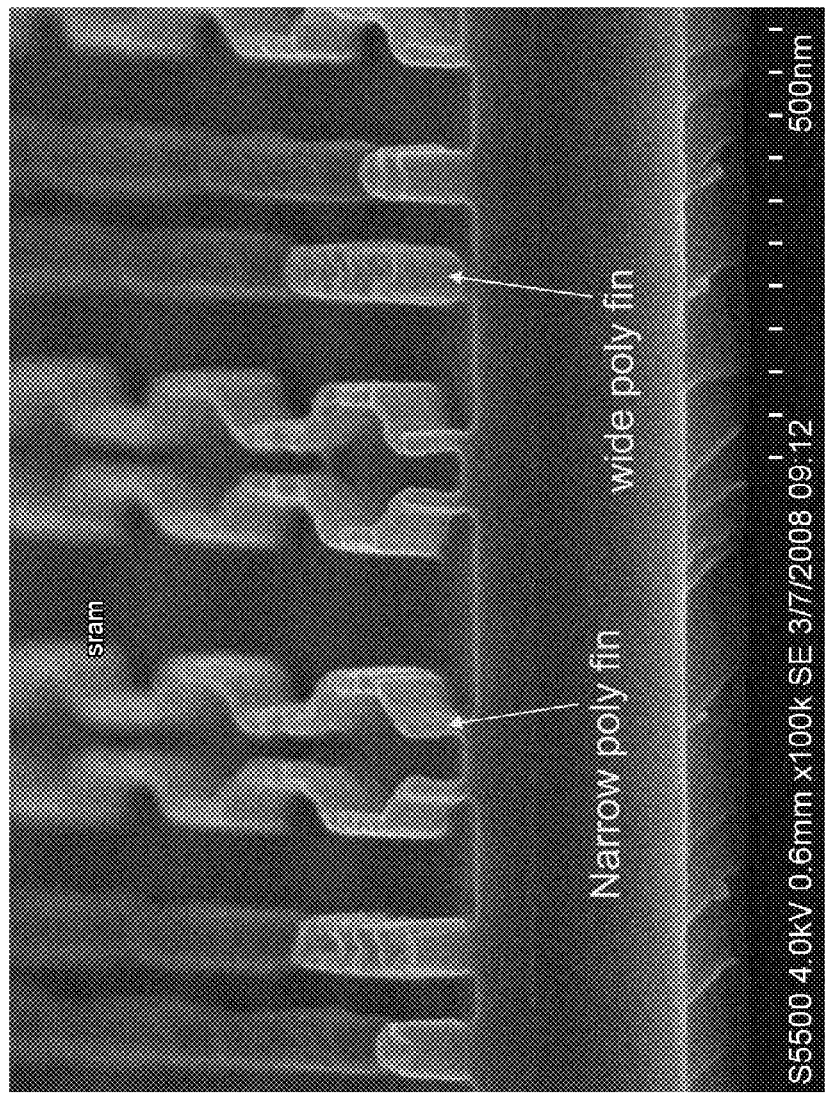
FIG. 8 is a microscopic photograph of the patterning achieved by the embodiments herein.

With the sidewall portions 130 standing on the primary layer 106, the method then patterns at least the primary layer 106 using the different sized sidewall portions 130 of the silicon mandrels 120, 126 as a patterning mask. For example, this process can also pattern a substrate 104 that is positioned below (relative to the undoped silicon layer 108) the primary layer 104. Then, the sidewall portions 130 of the silicon mandrels 120, 126 are removed to leave at least the primary layer 106 (and the substrate 104) patterned, as shown in FIG. 7. The openings in the photoresist have a size equivalent to the then currently known smallest state-of-the-art photoresist opening size, allowing the structures patterned in the primary layer 106 (and the substrate 100-104) to be "sub-lithographic" in size. An exemplary microscopic photograph of the more relatively narrow polysilicon fins and the relatively wider polysilicon fins is illustrated in FIG. 8.

Figure 9:
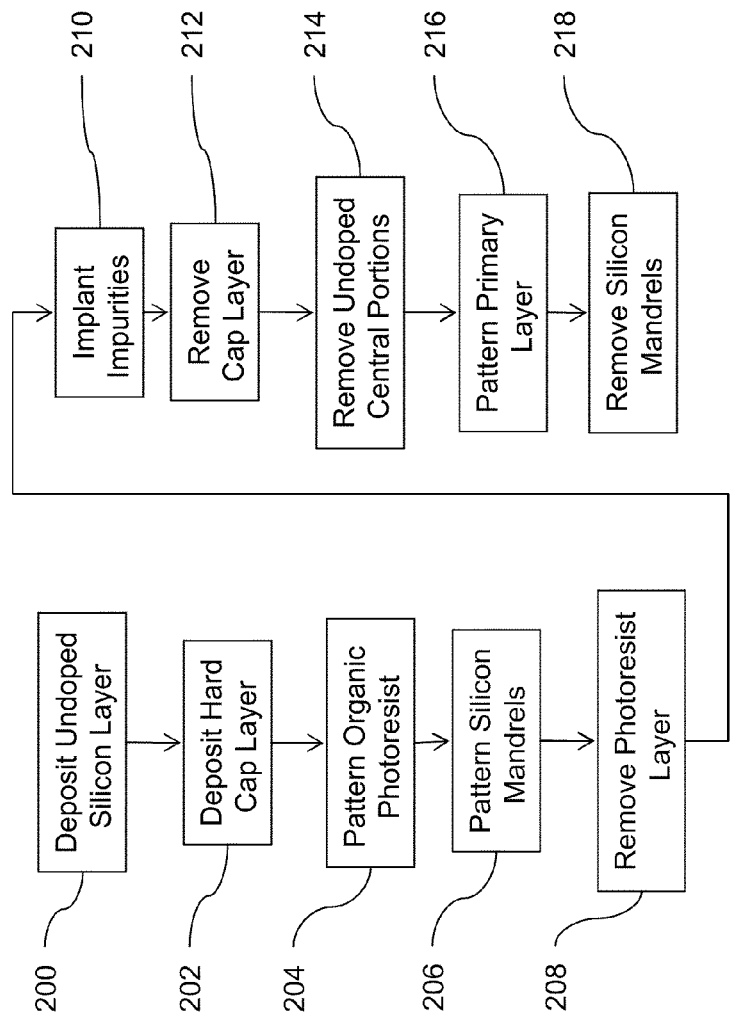
FIG. 9 is a flowchart illustrating a method according to embodiments herein.

The methodologies utilized herein are also shown in flowchart form in FIG. 9. More specifically, in item 200, the flow begins by depositing an undoped silicon layer (undoped amorphous silicon or undoped polysilicon) on a pad layer. In item 202, the method deposits a hard cap layer (e.g., nitride, etc.) on the undoped silicon layer. Then an organic photoresist layer (e.g., organic, etc.) is patterned on the cap layer in item 204.

The undoped silicon layer is patterned into silicon mandrels in item 206 by performing a material removal process (e.g., etching, etc.) to remove portions of the undoped silicon layer and corresponding portions of the cap layer exposed by openings in the photoresist layer. The openings in the photoresist layer are spaced such that at least some of the silicon mandrels are formed into different sizes. The photoresist layer is then removed in item 208 to leave the silicon mandrels standing on the primary layer and the cap layer portions standing (e.g., cap layer mandrels) on the silicon mandrels.

The method then implants impurities (e.g., boron) into sidewalls of the silicon mandrels in item 210 in a process that leaves sidewall portions of the silicon mandrels doped with impurities and that leaves central portions of at least some of the silicon mandrels undoped. The "central" portions of the silicon mandrels are between the "sidewall" portions of the silicon mandrels, within the individual silicon mandrels that are wide enough to form such portions. The implanting process 210 can comprise, for example, an angled ion implantation process, a plasma immersion ion implantation process, etc.

Some embodiments herein form all the silicon mandrels to be the same size (have the same width); while other embodiments will be formed to have different widths. If different width silicon mandrels are formed, at least some of the relatively more narrow silicon mandrels are not wide enough to have the central portions that are undoped, and only have the sidewall portions that are doped. This occurs because, in the relatively more narrow silicon mandrels, the width of the implanted portions (sidewalls) is greater than one-half the width of the silicon mandrels, where the sidewall portions adjoin each other in pairs, allowing the entire relatively more narrow silicon mandrel to contain the implanted impurity.

Next, in item 212, the method removes the cap layer mandrels to leave the silicon mandrels standing unprotected on the primary layer. A selective etching material removal process (e.g., ammonia etching) is performed in item 214 to remove the undoped central portions of the silicon mandrels and to leave the sidewall portions of the silicon mandrels standing on the primary layer.

For embodiments that form different width silicon mandrels, this process leaves differently sized sidewall portions of the silicon mandrels standing on the primary layer. The ones of the silicon mandrels that did not have the central portions that were undoped (and only had the adjoining sidewall portions that were doped) in effect comprise larger combined sidewall portions relative to the smaller individual sidewall portions of the silicon mandrels that had been separated by the (now removed) central portions.

With the sidewall portions standing on the primary layer, the method then patterns at least the primary layer using the different sized sidewall portions of the silicon mandrels as a patterning mask in item 216. For example, this process can also pattern a substrate that is positioned below (relative to the undoped silicon layer) the primary layer. Then, the sidewall portions of the silicon mandrels are removed in item 218 to leave at least the primary layer (and the substrate) patterned. The openings in the photoresist have a size equivalent to the then currently known smallest state-of-the-art photoresist opening size, allowing the structures patterned in the primary layer (and the substrate) to be "sub-lithographic" in size.

The resulting integrated circuit chip can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

What is claimed is:

1. A method comprising:
   depositing an undoped silicon layer on a primary layer;
   depositing a cap layer on said undoped silicon layer;
   patterning a photoresist layer on said cap layer, said photoresist layer having openings;
   patterning said undoped silicon layer into silicon mandrels by removing portions of said undoped silicon layer and corresponding portions of said cap layer exposed by said openings in said photoresist layer;
   removing said photoresist layer to leave said silicon mandrels standing on said primary layer and cap layer mandrels on said silicon mandrels;
   incorporating impurities into sidewalls of said silicon mandrels in a process that leaves sidewall portions of said silicon mandrels doped with impurities and that leaves central portions of at least some of said silicon mandrels undoped, said central portions of said silicon mandrels being between said sidewall portions of said silicon mandrels, within individual silicon mandrels;
   removing said cap layer mandrels to leave said silicon mandrels standing on said primary layer;
   performing a selective material removal process to remove said central portions of said silicon mandrels and to leave said sidewall portions of said silicon mandrels standing on said primary layer;
   patterning at least said primary layer using said sidewall portions of said silicon mandrels as a patterning mask; and
   removing said sidewall portions of said silicon mandrels to leave at least said primary layer patterned.

2. The method according to claim 1, said undoped silicon layer comprising one of amorphous silicon and polysilicon.

3. The method according to claim 1, said incorporating of said impurities comprising one of an angled ion implantation, plasma doping, plasma immersion ion implantation, cluster doping, infusion doping, gas phase doping, liquid phase doping, and solid phase doping.

4. The method according to claim 1, said patterning of said primary layer comprising patterning a substrate as positioned below said primary layer, relative to said undoped silicon layer.

5. The method according to claim 1, said openings in said photoresist having a size equivalent to a smallest known state-of-the-art photoresist opening size.

6. A method comprising:
   depositing an undoped silicon layer on a primary layer;
   depositing a cap layer on said undoped silicon layer;
   patterning a photoresist layer on said cap layer, said photoresist layer having openings;
   patterning said undoped silicon layer into silicon mandrels by removing portions of said undoped silicon layer and corresponding portions of said cap layer exposed by said openings in said photoresist layer, said openings being spaced such that ones of said silicon mandrels are formed into different sizes;
   removing said photoresist layer to leave said silicon mandrels standing on said primary layer and cap layer mandrels on said silicon mandrels;
   incorporating impurities into sidewalls of said silicon mandrels in a process that leaves sidewall portions of said silicon mandrels doped with impurities and that leaves central portions of at least some of said silicon mandrels undoped, said central portions of said silicon mandrels being between said sidewall portions of said silicon mandrels, within individual silicon mandrels;
   removing said cap layer mandrels to leave said silicon mandrels standing on said primary layer;
   performing a selective material removal process to remove said central portions of said silicon mandrels and to leave said sidewall portions of said silicon mandrels standing on said primary layer;
   patterning at least said primary layer using said sidewall portions of said silicon mandrels as a patterning mask; and
   removing said sidewall portions of said silicon mandrels to leave at least said primary layer patterned.

7. The method according to claim 6, said undoped silicon layer comprising one of amorphous silicon and polysilicon.

8. The method according to claim 6, said incorporating of said impurities comprising one of an angled ion implantation, plasma doping, plasma immersion ion implantation, cluster doping, infusion doping, gas phase doping, liquid phase doping, and solid phase doping.

9. The method according to claim 6, said patterning of said primary layer comprising patterning a substrate as positioned below said primary layer, relative to said undoped silicon layer.

10. The method according to claim 6, said openings in said photoresist having a size equivalent to a smallest known state-of-the-art photoresist opening size.

11. A method comprising:
depositing an undoped silicon layer on a primary layer;
depositing a cap layer on said undoped silicon layer;
patterning a photoresist layer on said cap layer, said photoresist having openings;
patterning said undoped silicon layer into silicon mandrels by removing portions of said undoped silicon layer and corresponding portions of said cap layer exposed by said openings in said photoresist layer, said openings being spaced such that ones of said silicon mandrels are formed into different sizes;
removing said photoresist layer to leave said silicon mandrels standing on said primary layer and cap layer mandrels on said silicon mandrels;
incorporating impurities into sidewalls of said silicon mandrels in a process that leaves sidewall portions of said silicon mandrels doped with impurities and that leaves central portions of at least some of said silicon mandrels undoped, said central portions of said silicon mandrels being between said sidewall portions of said silicon mandrels, within individual silicon mandrels, wherein at least some of said silicon mandrels do not have said central portions that are undoped, and only have said sidewall portions that are doped;
removing said cap layer mandrels to leave said silicon mandrels standing on said primary layer;
performing a selective material removal process to remove said central portions of said silicon mandrels and to leave differently sized sidewall portions of said silicon mandrels standing on said primary layer, wherein ones of said silicon mandrels that do not have said central portions that are undoped, and only have said sidewall portions that are doped, comprise larger sidewall portions relative to smaller sidewall portions of said silicon mandrels that have said central portions;
patterning at least said primary layer using said different sized sidewall portions of said silicon mandrels as a patterning mask; and
removing said sidewall portions of said silicon mandrels to leave at least said primary layer patterned.

12. The method according to claim 11, said undoped silicon layer comprising one of amorphous silicon and polysilicon.

13. The method according to claim 11, said incorporating of said impurities comprising one of an angled ion implantation, plasma doping, plasma immersion ion implantation, cluster doping, infusion doping, gas phase doping, liquid phase doping, and solid phase doping.

14. The method according to claim 11, said patterning of said primary layer comprising patterning a substrate as positioned below said primary layer, relative to said undoped silicon layer.

15. The method according to claim 11, said openings in said photoresist having a size equivalent to a smallest known state-of-the art photoresist opening size.

16. A method comprising:
depositing an undoped silicon layer on a primary layer;
depositing a nitride cap layer on said undoped silicon layer;
patterning an organic photoresist layer on said cap layer, said photoresist layer having openings;
patterning said undoped silicon layer into silicon mandrels by performing an etching process to remove portions of said undoped silicon layer and corresponding portions of said cap layer exposed by said openings in said photoresist layer, said openings being spaced such that ones of said silicon mandrels are formed into different sizes;
removing said photoresist layer to leave said silicon mandrels standing on said primary layer and cap layer mandrels on said silicon mandrels;
implanting boron impurities into sidewalls of said silicon mandrels in a process that leaves sidewall portions of said silicon mandrels doped with impurities and that leaves central portions of at least some of said silicon mandrels undoped, said central portions of said silicon mandrels being between said sidewall portions of said silicon mandrels, within individual silicon mandrels, wherein at least some of said silicon mandrels do not have said central portions that are undoped, and only have said sidewall portions that are doped;
removing said cap layer mandrels to leave said silicon mandrels standing on said primary layer;
performing a selective ammonia etching material removal process to remove said central portions of said silicon mandrels and to leave differently sized sidewall portions of said silicon mandrels standing on said primary layer, wherein ones of said silicon mandrels that do not have said central portions that are undoped, and only have said sidewall portions that are doped, comprise larger sidewall portions relative to smaller sidewall portions of said silicon mandrels that have said central portions;
patterning at least said primary layer using said different sized sidewall portions of said silicon mandrels as a patterning mask; and
removing said sidewall portions of said silicon mandrels to leave at least said primary layer patterned.

17. The method according to claim 16, said undoped silicon layer comprising one of amorphous silicon and polysilicon.

18. The method according to claim 16, said incorporating of said impurities comprising one of an angled ion implantation, plasma doping, plasma immersion ion implantation, cluster doping, infusion doping, gas phase doping, liquid phase doping, and solid phase doping.

19. The method according to claim 16, said patterning of said primary layer comprising patterning a substrate as positioned below said primary layer, relative to said undoped silicon layer.

20. The method according to claim 16, said openings in said photoresist having a size equivalent to a smallest known state-of-the-art photoresist opening size.

* * * * *